(12) United States Patent
Ogura

(10) Patent No.: US 10,251,262 B2
(45) Date of Patent: Apr. 2, 2019

(54) STRETCHABLE WIRING BOARD

(71) Applicant: FUJIKURA LTD., Tokyo (JP)

(72) Inventor: Shingo Ogura, Sakura (JP)

(73) Assignee: FUJIKURA LTD., Tokyo (JP)

( * ) Notice: Subject to any disclaimer, the term of this patent is extended or adjusted under 35 U.S.C. 154(b) by 11 days.

(21) Appl. No.: 15/547,851

(22) PCT Filed: Jan. 28, 2016

(86) PCT No.: PCT/JP2016/052447
§ 371 (c)(1),
(2) Date: Aug. 1, 2017

(87) PCT Pub. No.: WO2016/125671
PCT Pub. Date: Aug. 11, 2016

(65) Prior Publication Data
US 2018/0249576 A1 Aug. 30, 2018

(30) Foreign Application Priority Data

Feb. 2, 2015 (JP) .................................. 2015-018482

(51) Int. Cl.
*H05K 1/02* (2006.01)
*H01B 5/14* (2006.01)
(Continued)

(52) U.S. Cl.
CPC ............ *H05K 1/0283* (2013.01); *H01B 5/14* (2013.01); *H05K 1/02* (2013.01); *H05K 1/118* (2013.01); *H05K 3/24* (2013.01); *H05K 3/285* (2013.01); *H05K 1/0393* (2013.01); *H05K 3/1283* (2013.01); *H05K 3/28* (2013.01);
(Continued)

(58) Field of Classification Search
CPC .......................... H05K 1/0277; H05K 1/0283
See application file for complete search history.

(56) References Cited

U.S. PATENT DOCUMENTS

2016/0037623 A1* 2/2016 Fjelstad ............... H05K 1/0203
361/720

FOREIGN PATENT DOCUMENTS

JP    2011-216562 A    10/2011
JP       5186160 B2     4/2013
(Continued)

OTHER PUBLICATIONS

International Search Report dated Apr. 19, 2016, issued in counterpart of International Application No. PCT/JP2016/052447 (2 pages).
(Continued)

*Primary Examiner* — Jeremy C Norris
(74) *Attorney, Agent, or Firm* — Westerman, Hattori, Daniels & Adrian, LLP

(57) ABSTRACT

A stretchable wiring board includes: a stretchable base; at least one stretchable wiring provided on the stretchable base; and a poorly stretchable member provided so as to overlap at least part of the stretchable wiring in a thickness direction looking at the stretchable base in planar view. The poorly stretchable member suppresses change in a resistance value of the stretchable wiring associated with stretching deformation of the stretchable base. As a result, stable operability can be secured without affecting an operating voltage of an electronic component.

11 Claims, 7 Drawing Sheets

(51) Int. Cl.
    *H05K 3/24*     (2006.01)
    *H05K 1/11*     (2006.01)
    *H05K 3/28*     (2006.01)
    *H05K 3/12*         (2006.01)
    *H05K 1/03*         (2006.01)

(52) U.S. Cl.
    CPC ..... *H05K 3/287* (2013.01); *H05K 2201/0133* (2013.01); *H05K 2201/0162* (2013.01); *H05K 2201/0187* (2013.01); *H05K 2201/09227* (2013.01)

(56) References Cited

FOREIGN PATENT DOCUMENTS

| | | |
|---|---|---|
| JP | 2013-145842 A | 7/2013 |
| JP | 2014-162124 A | 9/2014 |
| JP | 2014-165441 A | 9/2014 |
| WO | 2012/133839 A1 | 10/2012 |

OTHER PUBLICATIONS

Extended (supplementary) European Search Report dated Feb. 6, 2018, issued in counterpart European Application No. 16746502.0. (6 pages).

* cited by examiner

A-A' Cross Section

B-B' Cross Section

C-C' Cross Section

D-D' Cross Section

E-E' Cross Section

STRETCHABLE WIRING BOARD

TECHNICAL FIELD

This invention relates to a stretchable wiring board in which a stretchable wiring is formed, and, in particular, relates to a stretchable wiring board capable of reducing change in a resistance value of a desired stretchable wiring associated with stretching deformation of the board.

BACKGROUND ART

In recent years, stretchable wiring boards capable of stretching in a curving manner or a planar manner, have been developed. For example, a flexible electrode structure (refer to Patent Document 1 listed below) is known as one of these stretchable wiring boards. This flexible electrode structure includes: a dielectric film made of an elastomer; and a flexible electrode disposed on a surface of this dielectric film to stretch according to elastic deformation of the dielectric film. The flexible electrode is configured from: a parent material of an elastomer; and a conductive material dispersed in this parent material.

PRIOR ART DOCUMENT

Patent Document

Patent Document 1: Japanese Patent No. 5186160

DISCLOSURE OF INVENTION

Problem to be Solved by the Invention

However, in the flexible electrode structure of the conventional technology disclosed in the above-listed Patent Document 1, when the flexible electrode is utilized as a stretchable wiring on a stretchable wiring board, a resistance value of the stretchable wiring ends up changing by the stretchable wiring board undergoing stretching deformation. Specifically, when the stretchable wiring board extends, this results in the resistance value of the stretchable wiring ending up increasing. In such a case, there is a risk that when, for example, an electronic component is mounted on the stretchable wiring board and operated, an operating voltage of the electronic component will be affected and operability will significantly deteriorate.

This invention has an object of solving the above-mentioned problems due to the conventional technology, and providing a stretchable wiring board capable of reducing change in a resistance value of a desired stretchable wiring associated with stretching deformation of the board.

Means for Solving the Problem

A stretchable wiring board according to the present invention is characterized in including: a stretchable base; at least one stretchable wiring provided on the stretchable base, the stretchable wiring having a wiring section and an electrode terminal section, the electrode terminal section being formed continuously with the wiring section; and a poorly stretchable member provided so as to overlap at least part of the stretchable wiring in a thickness direction looking at the stretchable base in planar view.

Due to the stretchable wiring board according to the present invention, a poorly stretchable member is provided so as to overlap at least part of a stretchable wiring in a thickness direction when a stretchable base is looked at in planar view. Therefore, extendibility of the stretchable wiring at a place overlapping a place provided with the poorly stretchable member can be lowered. This makes it possible to suppress extension of the stretchable wiring at said place and reduce change in a resistance value, that is, suppress increase in the resistance value associated with this extension. Therefore, it is possible to achieve a structure in which change in the resistance value of a desired stretchable wiring associated with stretching deformation of the board is reduced, whereby, when, for example, an electronic component is mounted on the stretchable wiring board and operated, operability of the electronic component is not affected.

In one embodiment of the present invention, the poorly stretchable member is provided so as to overlap at least a formation region of the wiring section.

In another embodiment of the present invention, the poorly stretchable member is provided so as to overlap at least a formation region of the electrode terminal section.

In another embodiment of the present invention, a plurality of the electrode terminal sections are arranged in line in a planar direction orthogonal to the thickness direction to configure an electrode terminal section group, and the poorly stretchable member is provided so as to overlap a formation region of the electrode terminal section group.

In yet another embodiment of the present invention, the poorly stretchable member is formed so as to be broader in the planar direction than the stretchable wiring.

In yet another embodiment of the present invention, the poorly stretchable member is provided between the stretchable base and the stretchable wiring.

In yet another embodiment of the present invention, the stretchable wiring includes at least a first stretchable wiring and a second stretchable wiring, the first stretchable wiring is provided so as to overlap the poorly stretchable member in the thickness direction, and the second stretchable wiring does not overlap the poorly stretchable member in the thickness direction.

Effect of the Invention

Due to the present invention, since a poorly stretchable member is provided so as to overlap at least part of a stretchable wiring in a thickness direction when a stretchable base is looked at in planar view, extendibility of the stretchable wiring at a place overlapping a place provided with the poorly stretchable member can be lowered, and change in a resistance value of a desired stretchable wiring associated with stretching deformation of the board can be reduced. Moreover, since change in the resistance value of the stretchable wiring can be reduced, it is possible to suppress an effect on an operating voltage of an electronic component when, for example, the electronic component is mounted on the stretchable wiring board and operated, and it is possible to suppress deterioration of operability.

MODES FOR CARRYING OUT THE INVENTION

Stretchable wiring boards according to embodiments of this invention will be described in detail below with reference to the accompanying drawings.

[First Embodiment]

Figure 1:
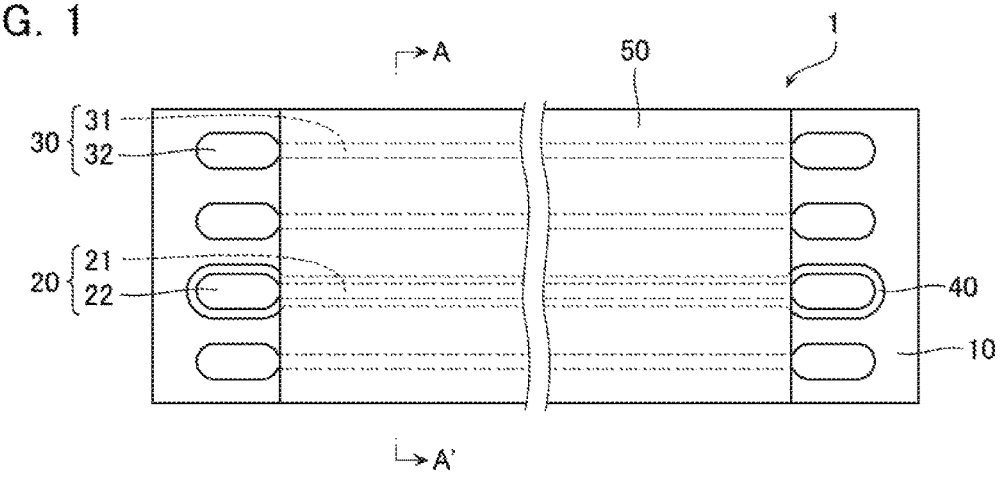
FIG. 1 is a plan view showing a stretchable wiring board according to a first embodiment of the present invention.
Figure 2:
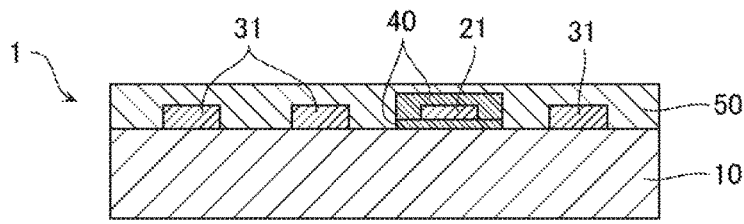
FIG. 2 is a cross-sectional view taken along the line A-A' of FIG. 1.
Figure 3:
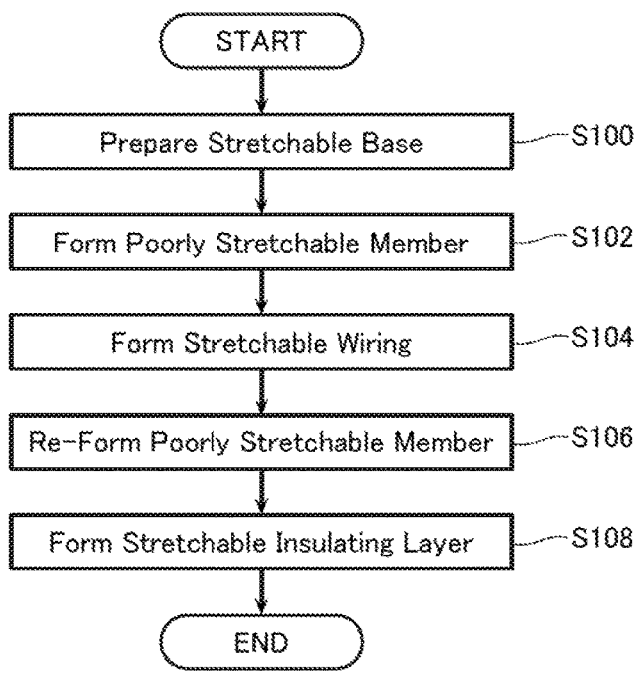
FIG. 3 is a flowchart showing manufacturing steps of the same stretchable wiring board.

FIG. 1 is a plan view showing a stretchable wiring board 1 according to a first embodiment of the present invention, and FIG. 2 is a cross-sectional view taken along the line A-A' of FIG. 1. Moreover, FIG. 3 is a flowchart showing manufacturing steps of the stretchable wiring board 1.

As shown in FIGS. 1 and 2, the stretchable wiring board 1 according to the first embodiment includes: a stretchable base 10; and first and second stretchable wirings 20, 30 arranged in line in plurality on this stretchable base 10. In addition, the stretchable wiring board 1 includes a poorly stretchable member 40 provided so as to overlap a formation region of the first stretchable wiring 20 in its thickness direction, for example, looking at the stretchable base 10 in planar view. Furthermore, the stretchable wiring board 1 includes a stretchable insulating layer 50 formed so as to cover above later-mentioned wiring sections 21, 31 of the first and second stretchable wirings 20, 30, for example.

Note that the first stretchable wiring 20 is a power supply line, for example, and the second stretchable wiring 30 is a signal line, for example. In addition, at least one of these first and second stretchable wirings 20, 30 should be provided on the stretchable base 10. Moreover, the poorly stretchable member 40 should be provided so as to overlap at least part of a desired stretchable wiring in its thickness direction.

The stretchable base 10 is configured by a stretchable material, and is configured from, for example, a rubber sheet or a fiber. A rubber sheet of the likes of silicone rubber, urethane rubber, acrylic rubber, fluoromubber, butyl rubber, styrene rubber, styrene-butadiene rubber, and chloroprene rubber, for example, may be cited as the rubber sheet. Another rubber material, elastomer material, or the like, may also be used.

Moreover, a woven fabric of the likes of rayon, acryl, polyurethane, vinylon, polyethylene, Nafion, aramid, nylon, polyester, and cotton, for example, may be cited as the fiber. Sheet materials or woven fabrics employing other various kinds of materials, and so on, may also be used. The stretchable material is not limited to those described above. A standard commercially available rubber sheet or fiber may also be used as these rubber sheet or fiber.

Note that in the embodiments according to the present invention, stretchability is exemplified by, for example, each material having a Young's modulus of less than 1 GPa, and preferably having a Young's modulus of less than 100 MPa, for example. In addition, stretchability also sometimes refers to having a sufficiently low Young's modulus with respect to the Young's modulus of the poorly stretchable member 40, in relation to the later-mentioned poorly stretchable member 40, for example. Sufficiently low means, for example, being not more than one hundredth of the Young's modulus of the poorly stretchable member 40, or the like.

The first and second stretchable wirings 20, 30 respectively include: the wiring sections 21, 31; and electrode terminal sections 22, 32 formed continuously with these wiring sections 21, 31. The electrode terminal sections 22, 32 are formed on both end sides of the wiring sections 21, 31, for example. These electrode terminal sections 22, 32 are portions electrically connected to an unillustrated electronic component or other connecting member.

The first and second stretchable wirings 20, 30 are configured by a stretchable wiring material, and are configured from a mixture of a conductive filler and an elastomer binder, for example. These stretchable wirings 20, 30 may employ a variety of conventional publicly known stretchable wirings (for example, a stretchable wiring disclosed in JP 2010-539650 W). The following may be employed as the conductive filler, namely, the likes of silver, copper, nickel, tin, bismuth aluminum, graphite, or a conductive polymer, for example. The conductive polymer is a so-called conductive polymer that conducts electricity, and has a characteristic of being capable of electrolytic stretching by oxidation-reduction.

Moreover, silicone or the above-mentioned rubber materials of the stretchable base 10 may also be employed as the elastomer binder. Note that other conductive fillers are also usable and, for example, a conductive adhesive agent having flexibility may also be employed in the first and second stretchable wirings 20, 30.

Note that shapes of the first and second stretchable wirings 20, 30 are configured having a straight line shape in FIG. 1, but are not limited to this, and may also be configured as the likes of a metal wiring formed in a meandering shape or a metal wiring formed in a bellows shape, for example.

In the present embodiment (FIG. 1), the electrode terminal sections 22, 32 are formed in a long round-cornered rectangular shape along a longitudinal direction of the wiring sections 21, 31. In addition, the electrode terminal sections 22, 32 may be formed in a variety of shapes, such as a rectangular shape, a circular shape, and an annular shape. Since the electronic component is connected to the electrode terminal sections 22, 32 during assembly, and so on, the electrode terminal sections 22, 32 have a structure that at least their surface is exposed. The following may be cited as the electronic component connected to the electrode terminal sections 22, 32, namely, for example, an active component of a semiconductor element of the likes of a transistor, integrated circuit (IC), or diode, or a passive component of the likes of a resistor, capacitor, relay, or piezoelectric element.

In the present embodiment, the poorly stretchable member 40 is provided formed continuously so as to overlap a formation region of the wiring section 21 and a formation region of the electrode terminal section 22 of the first stretchable wiring 20 in the thickness direction, when looked at in planar view. Since, as mentioned above, the first stretchable wiring 20 is employed as, for example, a power supply line, its functional tolerance of change in resistance value is to an extreme degree smaller than that of another second stretchable wiring 30 employed as a signal line. Therefore, extension of the first stretchable wiring 20 must be suppressed by the poorly stretchable member 40.

Specifically, in the formation region of the wiring section 21, the poorly stretchable member 40 completely overlaps the wiring section 21 and is provided more broadly than the wiring section 21, in a portion between the stretchable base 10 and the wiring section 21 on the inside of the stretchable insulating layer 50. In addition, the poorly stretchable member 40 is provided so as to cover a side and upper part of the wiring section 21 with the same width as a width of the portion between the stretchable base 10 and the wiring section 21. Therefore, the poorly stretchable member 40 is provided so as to surround all four sides in cross section of the wiring section 21.

On the other hand, in the formation region of the electrode terminal section 22, the poorly stretchable member 40 is provided so as to completely overlap the electrode terminal section 22 and so as to have a shape which is broader to an outer side than an outer periphery of the electrode terminal section 22, in a portion between the stretchable base 10 and the electrode terminal section 22. In this way, when the poorly stretchable member 40 is provided so as to overlap the formation region of the wiring section 21 and the formation region of the electrode terminal section 22 broadly and in a wide range as described above, it becomes possible for an effect of the present invention, that is, that it is made difficult for the first stretchable wiring 20 which is the power supply line to undergo stretching deformation, to be displayed to the highest degree.

Note that the poorly stretchable member 40 displays effects of the present invention provided at least part of it overlaps the wiring section 21, and so on. A region that is made difficult to undergo stretching deformation by the poorly stretchable member 40 in the stretchable wiring board 1 is a region of all of the stretchable base 10, the first stretchable wiring 20, and the stretchable insulating layer 50 included in the thickness direction over an area in the planar direction of a portion where the poorly stretchable member 40 is formed.

The poorly stretchable member 40 is configured by a material whose Young's modulus is higher than that of the stretchable base 10 or the stretchable insulating layer 50, and both an insulative material and a conductive material may be used in the poorly stretchable member 40. Of these, an insulative resin material is most suitable due to its good handling properties. Specifically, an epoxy resin, phenol resin, acrylic resin, urethane resin, vinyl resin, polycarbonate, polyester, polyethylene, polyolefin, polyimide, and so on, may be cited as the resin material.

Note that when the poorly stretchable member 40 is configured by a conductive material, it becomes required that its surface is provided with an insulating coating and that it does not short-circuit with an adjacently arranged stretchable wiring, and so on. On the other hand, in the case that the poorly stretchable member 40 employs a metal of good conductivity such as copper or silver obtained by the likes of plating or sputtering, and is installed so as to contact an arbitrary stretchable wiring, an accompanying effect that the resistance value of that stretchable wiring overall lowers, is shown. Therefore, there may resultantly be a more suitable configuration to counter a problem of the conventional technology that the resistance value of a wiring increases due to extension of the board. In addition, it is also possible to employ an insulative inorganic material in the poorly stretchable member 40.

This poorly stretchable member 40 preferably has a Young's modulus of greater than or equal to 1 GPa and an elastic deformation region of less than 5%, for example. The above-mentioned materials configuring the poorly stretchable member 40 are all assumed to meet this requirement. Moreover, even when, for example, the Young's modulus is less than 1 GPa and/or the elastic deformation region is greater than or equal to 5%, it is also possible to employ a material having a sufficiently high Young's modulus with respect to the Young's modulus of the stretchable base 10 of the stretchable wiring board 1.

Now, sufficiently high refers to, for example, the Young's modulus of the poorly stretchable member 40 being 100 or more times the Young's modulus of the stretchable base 10. As an example, when the stretchable base 10 employs an elastomer material or fiber material whose Young's modulus is about 1 MPa, a material whose Young's modulus is 100 MPa or more should be employed in the poorly stretchable member 40. As a result, a relative ease-of-extension with respect to the stretchable base 10 can be sufficiently reduced. The following may be cited as such a material, namely, the likes of silicone, urethane rubber, acrylic rubber, fluororubber, butyl rubber, styrene rubber, styrene-butadiene rubber, and chloroprene rubber. In addition, it is also possible to employ a material whose Young's modulus has been raised overall by mixing a filler of high Young's modulus into these materials.

The stretchable insulating layer 50 is configured from a material having stretchability and insulating properties, and, for example, an elastomer material may be appropriately employed. The following may be employed as the elastomer material, namely, for example, the likes of styrene rubber, styrene-butadiene rubber, chloroprene rubber, acrylic rubber, urethane rubber, silicone rubber, fluororubber, styrene rubber, styrene-butadiene rubber, and chloroprene rubber, and other elastomer materials may also be used.

The stretchable wiring board 1 according to the first embodiment configured in this way provides the poorly stretchable member 40 so as to overlap all of the formation region of the first stretchable wiring 20 as described above. Therefore, it becomes possible to suppress extension of the entire first stretchable wiring 20. Hence, even when the first stretchable wiring 20 is employed as a power supply line of an electronic component, stable operability can be secured without an operating voltage of the electronic component being affected by change in a resistance value associated with stretching deformation.

Particularly, when manufacturing a wiring to be employed as a power supply line like the first stretchable wiring 20 in the above-described kind of stretchable wiring board 1, generally, there arises the need to configure such that not more than a certain resistance value is attained even when the wiring extends. However, in the conventional technology, control of dimensional tolerance when manufacturing the likes of a wiring was extremely difficult, hence it was not easy for operability of the electronic component to be stably secured.

In this regard, the stretchable wiring board 1 of the present embodiment achieves a simple configuration of only providing the poorly stretchable member 40 to the whole of a first stretchable wiring 20 as an arbitrary place whose extension it is desired to prevent. This makes it possible for operability of the electronic component to be stably secured by a simple configuration, without manufacturing being performed considering dimensional tolerance of the stretchable wiring itself on the base. Moreover, since such a working effect can be displayed, it becomes possible for a stretchable wiring board 1 having a structure including at least the first stretchable wiring 20 which is a power supply line and having intermixed therein the second stretchable wiring 30 which is a signal line, to be manufactured and achieved by a simple structure.

[Manufacturing Steps of Stretchable Wiring Board]

Next, manufacturing steps of the stretchable wiring board 1 will be described with reference to FIG. 3.

First, the stretchable base 10 is prepared (step S100). Here, for example, a silicone rubber sheet whose Young's modulus is 1 MPa is employed as the stretchable base 10. Next, the poorly stretchable member 40 is formed in a region broader than a proposed formation region of the first stretchable wiring 20 on the stretchable base 10 (step S102).

The poorly stretchable member 40 is formed by, for example, patterning an ink-like material including the above-mentioned materials, and so on, by screen printing, silk printing, a dispensing method, or the like. Then, the ink-like material is dried and hardened by performing heat treatment or electromagnetic wave irradiation treatment (hardening treatment), thereby forming the poorly stretchable member 40.

In addition, the poorly stretchable member 40 may be formed by, for example, a material generally employed in potting, adhesion, and another coating field for insulation, molding, and protection. Moreover, the poorly stretchable member 40 may be configured by adhering a solid non-ink-like material such as a hot melt, a metal material or the like that has been pattern plated, or a film-like or tape-like material.

When the poorly stretchable member 40 has been formed on the stretchable base 10 in this way, the first and second stretchable wirings 20, 30 are formed (step S104). The first stretchable wiring 20 is pattern formed on the poorly stretchable member 40, and the second stretchable wiring 30 is pattern formed on the stretchable base 10.

The first and second stretchable wirings 20, 30 are formed by, for example, coating an ink-like material of a conductive filler kneaded and mixed into an elastomer binder, by a method such as dispensing, screen printing or gravure printing. Then, the above-described kind of hardening treatment is performed, thereby forming the first and second stretchable wirings 20, 30. Note that a standard conductive flexible adhesive agent may be employed as the ink-like material here, or a variety of conventional publicly known materials (for example, a material disclosed in JP 2010-539650 W) may be employed.

Then, the poorly stretchable member 40 is re-formed on the poorly stretchable member 40 and the wiring section 21 of the first stretchable wiring 20 (step S106). This results in a state that the wiring section 21 of the first stretchable wiring 20 is covered by the poorly stretchable member 40. Note that the poorly stretchable members 40 respectively formed in the above-described step S102 and this step S106 may be configured from identical materials or may be configured from different materials.

Finally, the stretchable insulating layer 50 is formed (step S108). The stretchable insulating layer 50 is formed on the stretchable base 10 so as to cover the entire formation regions of the wiring sections 21, 31 excluding the electrode terminal sections 22, 32 of the first and second stretchable wirings 20, 30, for example. Specifically, the stretchable insulating layer 50 is formed by coating an ink-like material configured from an elastomer, by a method such as bar coating, screen printing, slit coating, or dip coating. Then, the above-described kind of hardening treatment is performed, thereby forming the stretchable insulating layer 50. Note that the ink-like material here may employ a rubber flexible material as a material for potting, adhesion, mold making, or molding for insulation coating or protection of a standard electronic component.

[Second Embodiment]

Figure 4:
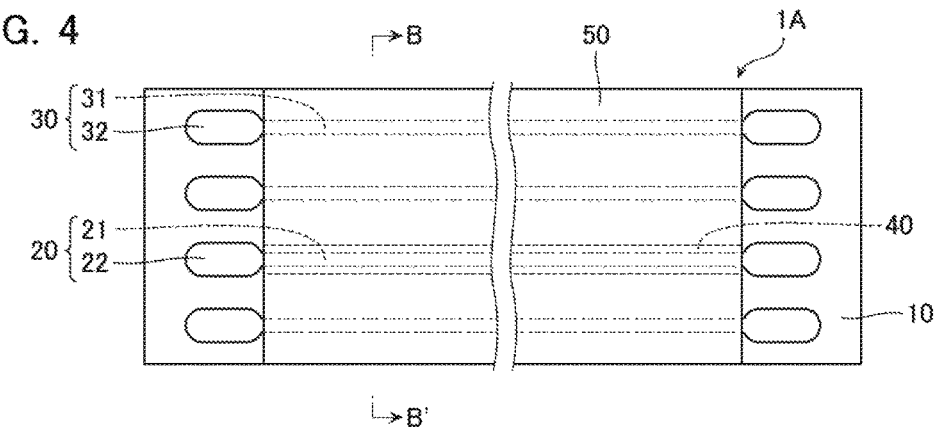
FIG. 4 is a plan view showing a stretchable wiring board according to a second embodiment of the present invention.
Figure 5:
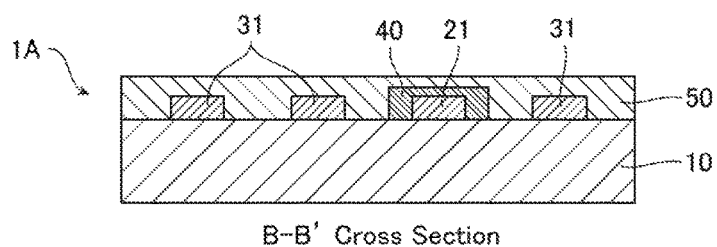
FIG. 5 is a cross-sectional view taken along the line B-B' of FIG. 4.

FIG. 4 is a plan view showing a stretchable wiring board 1A according to a second embodiment of the present invention, and FIG. 5 is a cross-sectional view taken along the line B-B' of FIG. 4. In FIGS. 4 and 5, configuring elements identical to those of the first embodiment (FIGS. 1 and 2) will be assigned with reference numerals identical to those assigned in the first embodiment, and duplicated descriptions thereof will be omitted below.

As shown in FIGS. 4 and 5, in the stretchable wiring board 1A according to the second embodiment, the poorly stretchable member 40 is not provided in the formation region of the electrode terminal section 22 of the first stretchable wiring 20. Moreover, the poorly stretchable member 40 is not provided in the portion between the stretchable base 10 and the wiring section 21. In these two points, the stretchable wiring board 1A of the second embodiment differs from the stretchable wiring board 1 of the first embodiment.

That is, in the stretchable wiring board 1A of the second embodiment, the poorly stretchable member 40 is configured provided so as to overlap only the formation region of the wiring section 21 of the first stretchable wiring 20 in the thickness direction, when looked at in planar view. Specifically, the poorly stretchable member 40 is formed over an entire length of the wiring section 21 so as to surround a surface portion (side and upper part) of the wiring section 21. However, the poorly stretchable member 40 is not formed in the formation region of the electrode terminal section 22, and the poorly stretchable member 40 is broken off between the wiring section 21 and the electrode terminal section 22. Formation timing of this poorly stretchable member 40 is, for example, after a formation step of the first stretchable wiring 20 and before a formation step of the stretchable insulating layer 50. This kind of configuration also enables similar working effects to those of the stretchable wiring board 1 of the first embodiment to be displayed.

[Third Embodiment]

Figure 6:
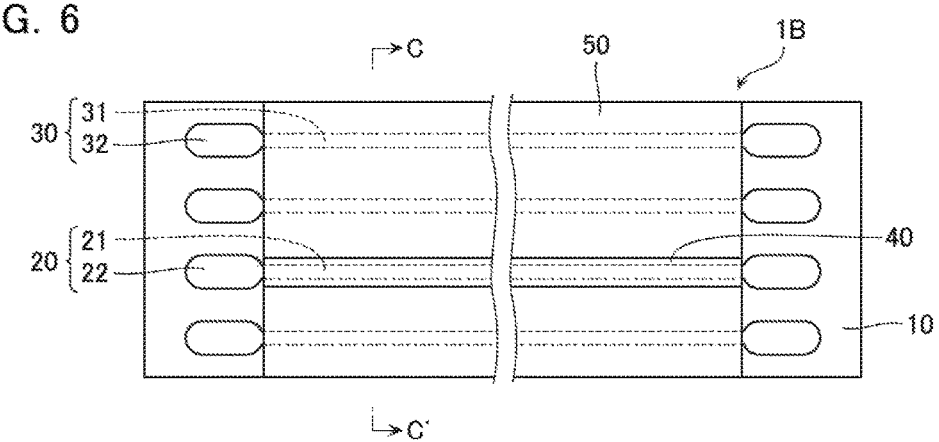
FIG. 6 is a plan view showing a stretchable wiring board according to a third embodiment of the present invention.
Figure 7:
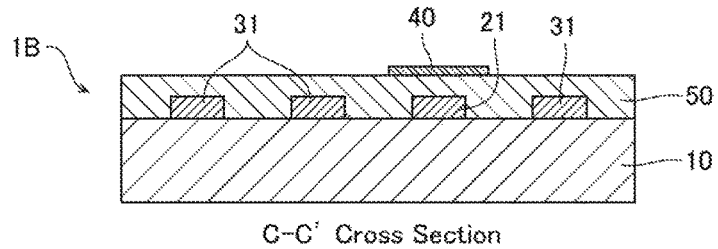
FIG. 7 is a cross-sectional view taken along the line C-C' of FIG. 6.

FIG. 6 is a plan view showing a stretchable wiring board 1B according to a third embodiment of the present invention, and FIG. 7 is a cross-sectional view taken along the line C-C' of FIG. 6. In FIGS. 6 and 7, configuring elements identical to those of the second embodiment (FIGS. 4 and 5) will be assigned with reference numerals identical to those assigned in the second embodiment, and duplicated descriptions thereof will be omitted below.

As shown in FIGS. 6 and 7, in the stretchable wiring board 1B according to the third embodiment, the poorly stretchable member 40 overlapping only the formation region of the wiring section 21 of the first stretchable wiring 20 in the thickness direction, when looked at in planar view, and not overlapping the formation region of the electrode terminal section 22, is similar to in the stretchable wiring board 1A of the second embodiment.

However, in the stretchable wiring board 1B according to the third embodiment, the poorly stretchable member 40 is formed on a surface of the stretchable insulating layer 50 and is configured not directly contacting the first stretchable wiring 20. This differs from the poorly stretchable member 40 being formed so as to contact the first stretchable wiring 20 in a lower layer of the stretchable insulating layer 50 in the stretchable wiring board 1A of the second embodiment. In this case, the poorly stretchable member 40 is ideally configured by adhering a poorly stretchable film material or tape material. Formation timing of this poorly stretchable member 40 is, for example, after the formation step of the stretchable insulating layer 50. This kind of configuration also enables the working effect of it being made difficult for a desired place of the stretchable wiring to be stretched, to be displayed, similarly to in the above-described embodiments.

[Fourth Embodiment]

Figure 8:
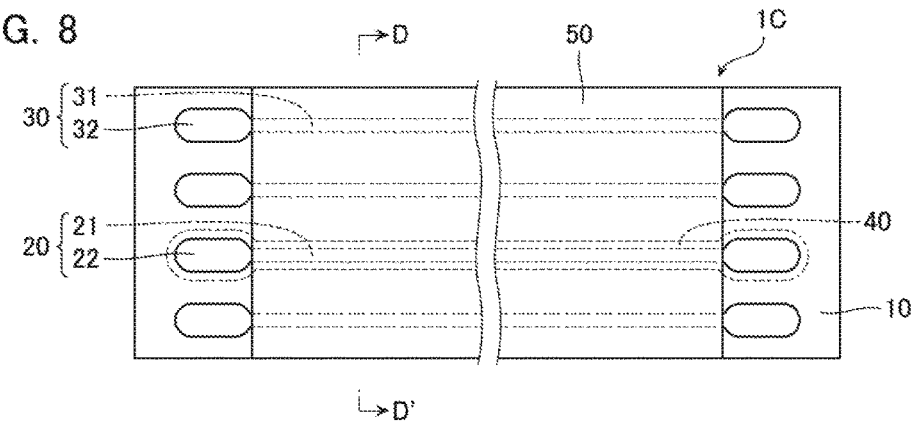
FIG. 8 is a plan view showing a stretchable wiring board according to a fourth embodiment of the present invention.
Figure 9:
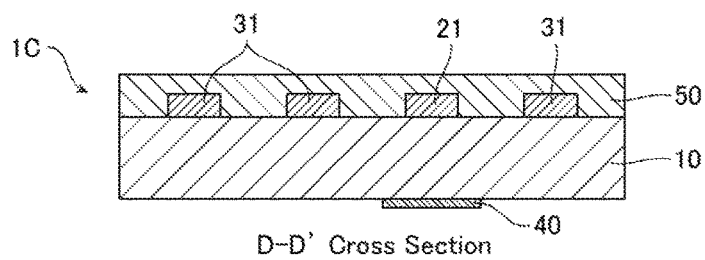
FIG. 9 is a cross-sectional view taken along the line D-D' of FIG. 8.

FIG. 8 is a plan view showing a stretchable wiring board 1C according to a fourth embodiment of the present invention, and FIG. 9 is a cross-sectional view taken along the line D-D' of FIG. 8. In FIGS. 8 and 9, configuring elements identical to those of the first embodiment (FIGS. 1 and 2) will be assigned with reference numerals identical to those assigned in the first embodiment, and duplicated descriptions thereof will be omitted below.

As shown in FIGS. 8 and 9, in the stretchable wiring board 1C according to the fourth embodiment, the poorly stretchable member 40 being provided formed continuously so as to overlap the formation region of the wiring section 21 and the formation region of the electrode terminal section 22 of the first stretchable wiring 20 in the thickness direction, when looked at in planar view, is similar to in the stretchable wiring board 1 of the first embodiment.

However, in the stretchable wiring board 1C according to the fourth embodiment, the poorly stretchable member 40 is formed on a back surface of the stretchable base 10 and is configured not directly contacting the first stretchable wiring 20. This differs from the poorly stretchable member 40 being formed so as to cover a side surface and upper surface and not only a lower surface of the first stretchable wiring 20 in the stretchable wiring board 1 of the first embodiment. In this case, similarly to as described above, the poorly stretchable member 40 should be configured by a poorly stretchable film material or tape material. In this case, formation timing of the poorly stretchable member 40 may be any timing. This kind of configuration also enables similar working effects to those of the stretchable wiring board 1 of the first embodiment to be displayed.

[Fifth Embodiment]

Figure 10:
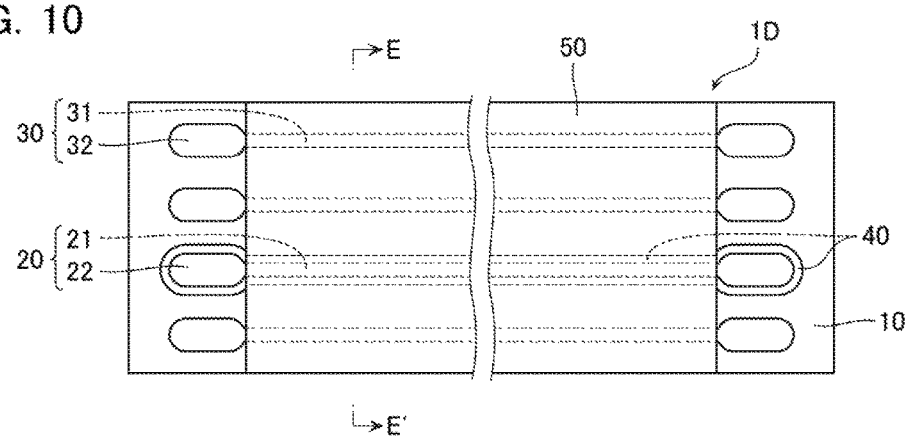
FIG. 10 is a plan view showing a stretchable wiring board according to a fifth embodiment of the present invention.
Figure 11:
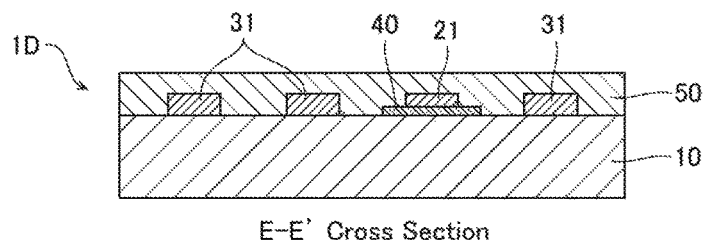
FIG. 11 is a cross-sectional view taken along the line E-E' of FIG. 10.

FIG. 10 is a plan view showing a stretchable wiring board 1D according to a fifth embodiment of the present invention, and FIG. 11 is a cross-sectional view taken along the line E-E' of FIG. 10. In FIGS. 10 and 11, configuring elements identical to those of the first and fourth embodiments (FIGS. 1 and 2, and 8 and 9) will be assigned with reference numerals identical to those assigned in the first and fourth embodiments, and duplicated descriptions thereof will be omitted below.

As shown in FIGS. 10 and 11, in the stretchable wiring board 1D according to the fifth embodiment, the poorly stretchable member 40 being provided formed continuously so as to overlap the formation region of the wiring section 21 and the formation region of the electrode terminal section 22 of the first stretchable wiring 20 in the thickness direction, when looked at in planar view, is similar to in the stretchable wiring boards 1, 1C of the first and fourth embodiments.

However, in the stretchable wiring board 1D according to the fifth embodiment, the poorly stretchable member 40 is formed only in a portion between the stretchable base 10 and the wiring section 21 and electrode terminal section 22. This differs from the poorly stretchable member 40 being formed so as to cover a side surface and upper surface and not only a lower surface of the first stretchable wiring 20 in the stretchable wiring boards 1, 1C of the first and fourth embodiments. Formation timing of this poorly stretchable member 40 is, for example, after a preparation step of the stretchable base 10 and before the formation step of the first stretchable wiring 20. This kind of configuration also enables similar working effects to those of the stretchable wiring boards 1, 1C of the first and fourth embodiments to be displayed.

[Modified Examples of Formation Place of Poorly Stretchable Member]

Figure 12:
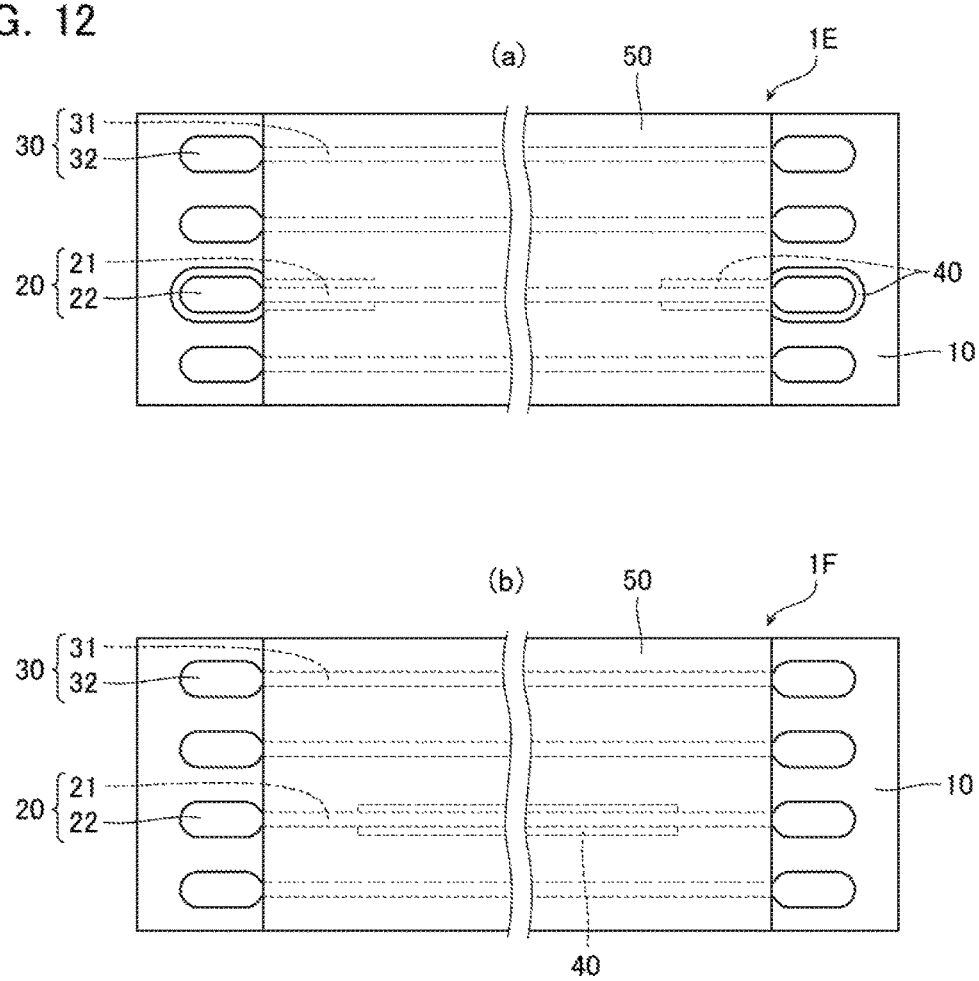
FIG. 12 is a plan view showing modified examples of the embodiment.
Figure 13:
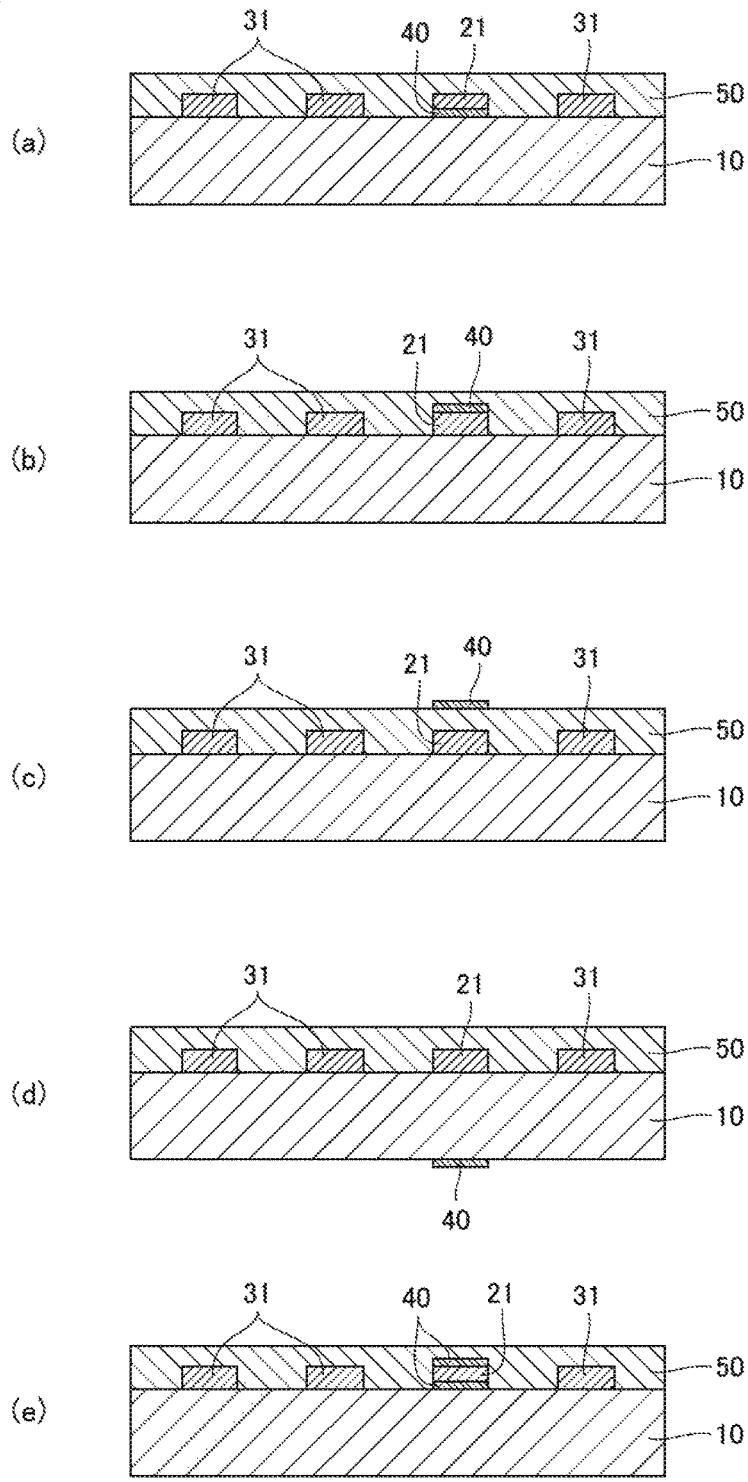
FIG. 13 is a cross-sectional view showing modified examples of the embodiment.

FIGS. 12 and 13 are plan views showing modified examples of the above-described embodiments.

FIG. 12(a) is a plan view of a stretchable wiring board 1E according to a first modified example. As shown in FIG. 12(a), it is possible to configure such that the poorly stretchable member 40 is formed only on both end section sides in the formation region of the wiring section 21 (is formed continuously in part of the formation region of the wiring section 21 and in the formation region of the electrode terminal section 22) of the first stretchable wiring 20, and is not formed in a central vicinity of the formation region of the wiring section 21 of the first stretchable wiring 20.

FIG. 12(b) is a plan view of a stretchable wiring board 1F according to a second modified example. As shown in FIG. 12(b), it is possible to configure such that the poorly stretchable member 40 is formed only in a central vicinity of the formation region of the wiring section 21 of the first stretchable wiring 20, and is not formed on both end section sides in the formation region of the wiring section 21 of the first stretchable wiring 20. In this way, stretching deformation of the wiring section 21 can be sufficiently suppressed, even by superimposing the poorly stretchable member 40 on only part of the formation region of the wiring section 21.

Moreover, the above-mentioned various kinds of embodiments described examples where the poorly stretchable member 40 was provided so as to be broader than the formation region of the first stretchable wiring 20 (the wiring section 21 and electrode terminal section 22). However, as shown in the modified examples of FIGS. 13(a) to (e), the poorly stretchable member 40 may be provided so as to have the same width as the formation region of the first stretchable wiring 20. Effects of the present invention can be well displayed, even when the poorly stretchable member 40 has such configurations.

[Sixth Embodiment]

Figure 14:
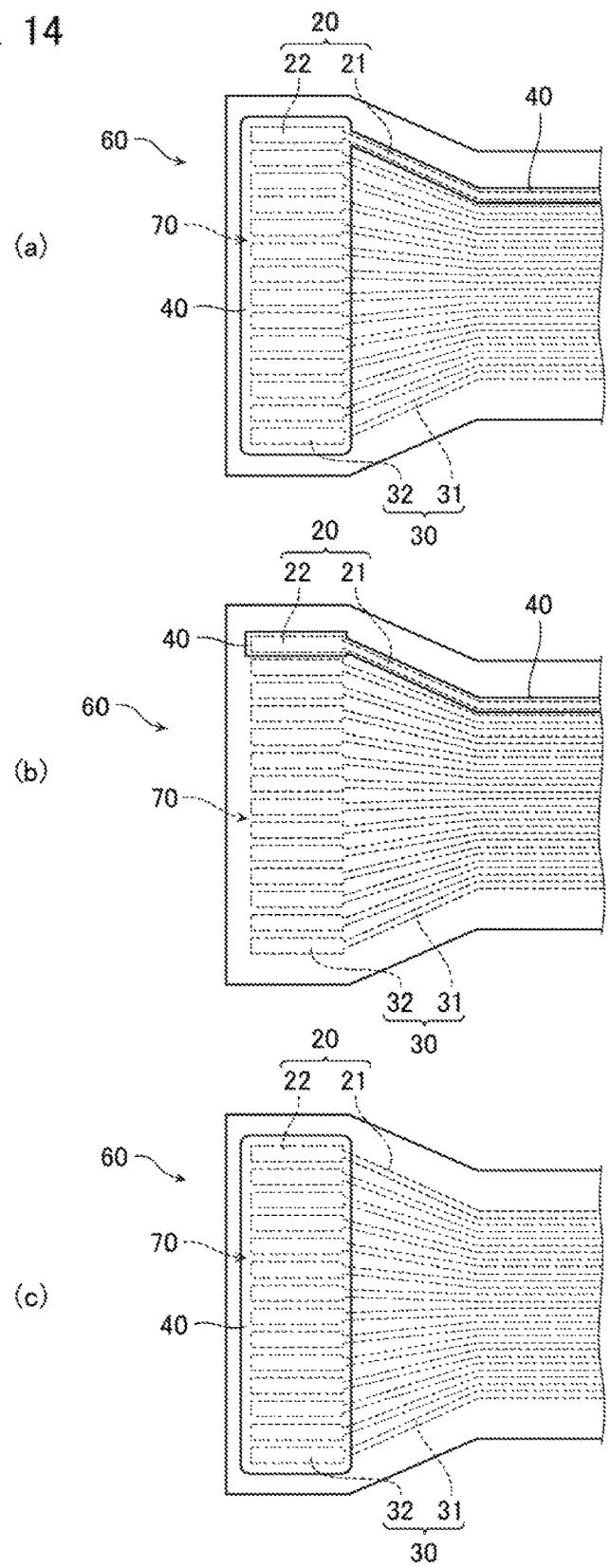
FIG. 14 is a plan view showing stretchable wiring boards according to a sixth embodiment of the present invention.

FIGS. 14(a) to (c) are plan views showing stretchable wiring boards according to a sixth embodiment of the present invention. In FIG. 14, configuring elements identical to those of the first embodiment (FIGS. 1 and 2) will be assigned with reference numerals identical to those assigned in the first embodiment, and duplicated descriptions thereof will be omitted below.

As shown in FIGS. 14(a) to (c), the stretchable wiring boards according to the sixth embodiment have their structure applied to a standard connector connecting portion 60. This connector connecting portion 60 is a portion for electrically connecting the stretchable wiring board to a partner connecting member (not illustrated) such as an unillustrated external power supply circuit or electronic component, for example, and includes an electrode terminal section group 70 in which the previously mentioned electrode terminal sections 22 and 32 are arranged in line. This electrode terminal section group 70 can be employed as a connector terminal or a component mounting terminal, for example.

FIG. 14 shows a state where, for example, a back surface side of the stretchable base 10 of the stretchable wiring board is looked at in planar view in a simplified manner. In this stretchable wiring board of FIG. 14, the plurality of wirings connected to the connector connecting portion 60 include the first stretchable wiring 20 functioning as the power supply line.

In the stretchable wiring boards like in these FIGS. 14(*a*) to (*c*), the poorly stretchable member 40 is disposed in at least part of the formation region of the first stretchable wiring 20 which is the power supply line and in at least part of the connector connecting portion 60. This makes it possible for change in the resistance value of the first stretchable wiring 20 due to stretching deformation to be reduced.

In the example shown in FIG. 14(*a*), the poorly stretchable member 40 is provided formed continuously so as to overlap the whole of a formation region of the electrode terminal section group 70 and the formation region of the first stretchable wiring 20. Moreover, in the example of FIG. 14(*b*), the poorly stretchable member 40 is provided formed continuously in only one of the plurality of wiring sections 21, 31 and electrode terminal sections 22, 32 of the first and second stretchable wirings 20, 30, so as to be formed in the formation region of the wiring section 21 of the first stretchable wiring 20 and in the formation region of the electrode terminal section 22 in the electrode terminal section group 70. Furthermore, in the example of FIG. 14(*c*), the poorly stretchable member 40 is provided only in a formation range of the whole of the formation region of the electrode terminal section group 70 and end sections (a vicinity of the electrode terminal section group 70) of the wiring section 21 and the wiring section 31. The most suitable mode in the sense of preventing stretching deformation is the configuration shown in FIG. 14(*a*).

Note that in the connector connecting portion 60, since the electrode terminal sections 22, 32 in the electrode terminal section group 70 are each required to be exposed, the above-described formation mode shown in FIG. 9 of the fourth embodiment or formation mode shown in FIG. 11 of the fifth embodiment is ideal as the formation mode of the poorly stretchable member 40. However, in the case that the poorly stretchable member 40 is not installed in other than the connector connecting portion 60 (that is, in the case like that shown in FIG. 14(*c*)), the formation mode shown in FIG. 9 is most preferable.

Due to the stretchable wiring boards of this sixth embodiment, the following kinds of accompanying effects can also be displayed, in addition to the above-mentioned working effects. That is, in the connector connecting portion 60, it is required to form in the electrode terminal section group 70 electrode terminal sections 22, 32 whose number of terminals or terminal pitches are matched to number of terminals or terminal pitches of the partner connecting member.

At this time, when the poorly stretchable member 40 is not provided in the connector connecting portion 60 as in a conventional stretchable wiring board, there is a possibility that due to the connector connecting portion 60 stretching during connection, the terminal pitch changes causing a connection failure. Moreover, because the stretchable wiring board naturally undergoes stretching deformation even after connector connection, there is a risk of the connector connecting portion 60 slipping out and disengaging when, for example, the stretchable wiring board has been extended. Furthermore, it is standard for the connector connecting portion 60 to be connected caulked by a hard member, hence if the connector connecting portion 60 has stretchability, then it results in the above-described kinds of disadvantages only becoming more apparent. These kinds of problems associated with the connector connecting portion 60 are not limited to the power supply line, and are commonly present also in the signal line 30. Hence, the same applies even when the electrode terminal sections of the electrode terminal section group 70 are all signal line electrode terminal sections 32.

In this regard, the stretchable wiring board of the present embodiment, by having the poorly stretchable member 40 provided in the connector connecting portion 60, makes it possible to lower extendibility of the stretchable wiring at a place overlapping a place where the poorly stretchable member 40 is provided. This makes it possible for extendibility of the stretchable wiring at said place to be suppressed, and for change in the resistance value associated with this to be reduced, that is, for increase in the resistance value associated with this to be suppressed. Moreover, it makes it possible for occurrence of a connection failure during connector connection or occurrence of slipping out to be prevented and for electrical connection with the partner connecting member to be reliably performed, regardless of whether a power supply line or a signal line.

[Seventh Embodiment]

Figure 15:
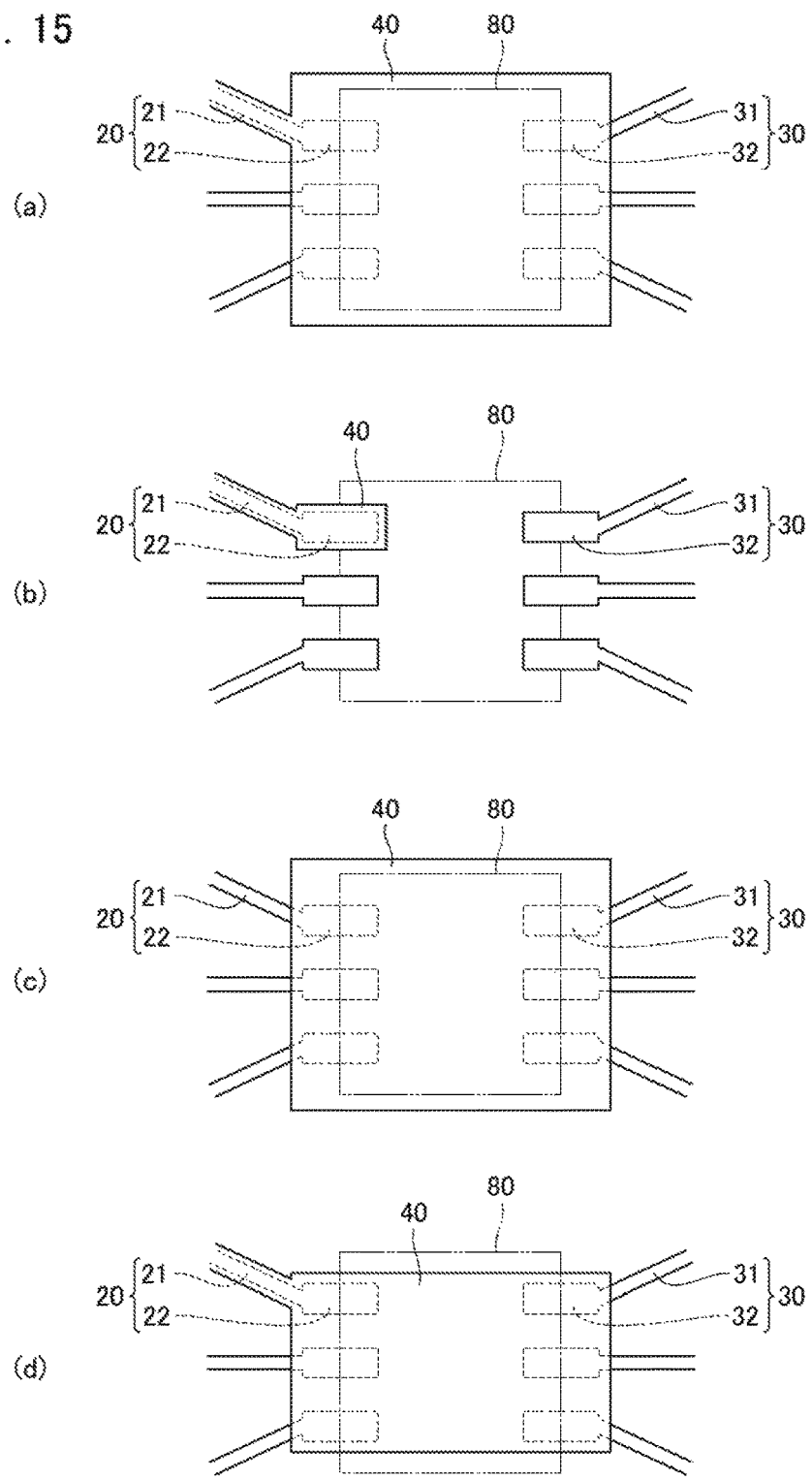
FIG. 15 is a plan view showing stretchable wiring boards according to a seventh embodiment of the present invention.

FIG. 15 is a plan view showing stretchable wiring boards according to a seventh embodiment of the present invention. In FIG. 15, configuring elements identical to those of the first embodiment (FIGS. 1 and 2) will be assigned with reference numerals identical to those assigned in the first embodiment, and duplicated descriptions thereof will be omitted below.

As shown in FIG. 15, the stretchable wiring boards according to the seventh embodiment have their structure applied to a mounting portion of a standard electronic component and to a vicinity of the mounting portion. FIG. 15 shows a state where, for example, a back surface side of the stretchable wiring board is looked at in planar view in a simplified manner. When the stretchable wiring board is employed as a mounting board on which the electronic component is mounted, the electrode terminal sections 22, 32 of the first and second stretchable wirings 20, 30 on the stretchable wiring board are disposed corresponded to terminal pitches and formation positions on a side of the electronic component whose mounting is supposed. The above-mentioned kinds of 1C, resistor, compact power supply, capacitor, and so on, may be cited as the electronic component to be mounted. Among these, it is particularly in the capacitor that there is an increased need to prevent change in the resistance value due to stretching of the first stretchable wiring 20 functioning as the power supply line.

In the case shown in FIG. 15(*a*), the poorly stretchable member 40 is formed continuously so as to be broader than a mounting region 80 of the electronic component, include all of the formation regions of the electrode terminal sections 22, 32 of the first and second stretchable wirings 20, 30, and overlap also part of the formation region of the wiring section 21 of the first stretchable wiring 20. Moreover, in FIG. 15(*b*), the poorly stretchable member 40 is formed continuously so as to overlap only the formation region of the wiring section 21 and the formation region of the electrode terminal section 22 of the first stretchable wiring 20 which is the power supply line.

Furthermore, as shown in FIG. 15(*c*), the poorly stretchable member 40 may be formed so as to be broader than the mounting region 80 of the electronic component and include all of the formation regions of the electrode terminal sections 22, 32 of the first and second stretchable wirings 20, 30. Moreover, as shown in FIG. 15(d), the poorly stretchable member 40 may be formed continuously so as to include all of the formation regions of the electrode terminal sections 22, 32, but cover only part of the mounting region 80 of the electronic component.

Generally, in the mounting region 80 where the electronic component is mounted and in the vicinity of the mounting region 80, when the stretchable wiring board extends whereby arrangement pitch of the electrode terminal sections 22, 32 ends up changing, it results in a connecting member such as solder or a conductive adhesive agent, ACF, or a through hole mounting pin, for example, getting broken. In this case, electrical connection is lost, and there ends up being a mounting failure. This kind of problem associated with mounting of the electronic component is also not particularly limited to the power supply line, and is commonly present also in the signal line. Hence, the same applies even when the electrode terminal sections formed in the mounting region 80 are all signal line electrode terminal sections 32.

In this regard, the stretchable wiring board of the present embodiment, since it has the poorly stretchable member 40 appropriately provided in the mounting region 80 of the electronic component and in the vicinity of the mounting region 80, results in lowered extendibility of the stretchable wiring at a place overlapping a place where the poorly stretchable member 40 is provided. Therefore, change in arrangement pitch of the electrode terminal sections 22, 32 can be suppressed, and breaking of the connecting member can be suppressed. Therefore, it becomes possible for occurrence of a mounting failure to be prevented, whereby the electronic component is reliably mounted on the stretchable wiring board. Now, the most suitable mode in the sense of mounting the electronic component is that shown in FIG. 15(a). Note that the stretchable wiring boards of the above-mentioned various kinds of embodiments may be configured to be carried out appropriately combining their structures. Moreover, the poorly stretchable member 40 may be provided within the stretchable insulating layer 50, for example, and disposed in a state of not directly contacting the wiring section 21 at least upwards of the wiring section 21.

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

DESCRIPTION OF REFERENCE NUMERALS 1 stretchable wiring board
10 stretchable base
20 first stretchable wiring
21 wiring section
22 electrode terminal section
30 second stretchable wiring
31 wiring section
32 electrode terminal section
40 poorly stretchable member
50 stretchable insulating layer

The invention claimed is:

1. A stretchable wiring board, comprising:
a stretchable base;
at least one stretchable wiring provided on the stretchable base, the stretchable wiring having a wiring section and an electrode terminal section, the electrode terminal section being formed continuously with the wiring section; and
a poorly stretchable member provided so as to overlap at least part of the stretchable wiring in a thickness direction looking at the stretchable base in planar view,
wherein the stretchable wiring comprises at least a first stretchable wiring and a second stretchable wiring,
the first stretchable wiring is provided so as to overlap the poorly stretchable member in the thickness direction, and
the second stretchable wiring does not overlap the poorly stretchable member in the thickness direction.

2. The stretchable wiring board according to claim 1, wherein
the poorly stretchable member is provided so as to overlap at least a formation region of the wiring section of the first stretchable wiring.

3. The stretchable wiring board according to claim 1, wherein
the poorly stretchable member is provided so as to overlap at least a formation region of the electrode terminal section of the first stretchable wiring.

4. The stretchable wiring board according to claim 3, wherein
a plurality of the electrode terminal sections of a plurality of the stretchable wirings each being the first stretchable wiring are arranged in line in a planar direction orthogonal to the thickness direction to configure an electrode terminal section group, and
the poorly stretchable member is provided so as to overlap a formation region of the electrode terminal section group.

5. The stretchable wiring board according to claim 1, wherein
the poorly stretchable member is formed so as to be broader in the planar direction than the first stretchable wiring.

6. The stretchable wiring board according to claim 1, wherein
the poorly stretchable member is provided between the stretchable base and the first stretchable wiring.

7. A stretchable wiring board, comprising:
a stretchable base;
at least one stretchable wiring provided on the stretchable base, the stretchable wiring having a wiring section and an electrode terminal section, the electrode terminal section being formed continuously with the wiring section; and
a poorly stretchable member provided so as to overlap at least part of the stretchable wiring in a thickness direction looking at the stretchable base in planar view,
wherein the poorly stretchable member is provided between the stretchable base and the stretchable wiring.

8. The stretchable wiring board according to claim 7, wherein
the poorly stretchable member is provided so as to overlap at least a formation region of the wiring section.

9. The stretchable wiring board according to claim 7, wherein the poorly stretchable member is provided so as to overlap at least a formation region of the electrode terminal section.

10. The stretchable wiring board according to claim 9, wherein
a plurality of the electrode terminal sections are arranged in line in a planar direction orthogonal to the thickness direction to configure an electrode terminal section group, and
the poorly stretchable member is provided so as to overlap a formation region of the electrode terminal section group.

11. The stretchable wiring board according to claim 7, wherein
the poorly stretchable member is formed so as to be broader in the planar direction than the stretchable wiring.

\* \* \* \* \*